US009373936B1

(12) United States Patent
Kanskar et al.

(10) Patent No.: US 9,373,936 B1
(45) Date of Patent: Jun. 21, 2016

(54) RESONANT ACTIVE GRATING MIRROR FOR SURFACE EMITTING LASERS

(71) Applicant: nLIGHT Photonics Corporation, Vancouver, WA (US)

(72) Inventors: Manoj Kanskar, Portland, OR (US); Zhigang Chen, Portland, OR (US); Jiamin Zhang, Vancouver, WA (US)

(73) Assignee: nLIGHT, Inc., Vancouver, WA (US)

( * ) Notice: Subject to any disclaimer, the term of this patent is extended or adjusted under 35 U.S.C. 154(b) by 0 days.

(21) Appl. No.: 14/611,124

(22) Filed: Jan. 30, 2015

Related U.S. Application Data

(60) Provisional application No. 61/933,811, filed on Jan. 30, 2014.

(51) Int. Cl.
| | |
|---|---|
| H01S 5/187 | (2006.01) |
| H01S 5/04 | (2006.01) |
| H01S 5/02 | (2006.01) |
| H01S 5/343 | (2006.01) |
| H01S 5/30 | (2006.01) |
| H01S 5/042 | (2006.01) |

(52) U.S. Cl.
CPC .............. *H01S 5/187* (2013.01); *H01S 5/0215* (2013.01); *H01S 5/041* (2013.01); *H01S 5/042* (2013.01); *H01S 5/3013* (2013.01); *H01S 5/34313* (2013.01)

(58) Field of Classification Search
CPC ..... H01S 5/187; H01S 5/0215; H01S 5/3013; H01S 5/34313; H01S 5/042
USPC .......... 372/43.01, 45.012, 50.11, 50.124, 102
See application file for complete search history.

(56) References Cited

U.S. PATENT DOCUMENTS

| | | | | |
|---|---|---|---|---|
| 5,345,466 A | * | 9/1994 | Macomber | H01S 5/187 372/102 |
| 2005/0030540 A1 | * | 2/2005 | Thornton | A61B 5/14532 356/432 |
| 2012/0120972 A1 | * | 5/2012 | Belenky et al. | B82Y 20/00 372/20 |

OTHER PUBLICATIONS

Beyertt et al., "Efficient Gallium-Arsenide Disk Laser," *IEEE Journal of Quantum Electronics*, 43(10): 860-875, Oct. 2007.
Laurain et al., "Power Scaling of High-Power Optically-Pumped Semiconductor Lasers for Continuous Wave and Ultrashort Pulse Generation," *Technology and Systems*, 8547: 854701, 2012.
Rosenblatt et al., "Resonant Grating Waveguide Structures," *IEEE Journal of Quantum Electronics*, 33(11): 2038-2059, Nov. 1997.
Saarinen et al., "Power scalable semiconductor disk laser using multiple gain cavity," *Optics Express*, 14(16): 12868-12871, Dec. 25, 2006.
Schulz et al., "Resonant optical in-well pumping of an (AlGaIn)(AsSb)-based vertical-external-cavity surface-emitting laser emitting at 2.35 μm," *Applied Physics Letters*, 9:09113, 2007.

* cited by examiner

*Primary Examiner* — Dung Nguyen
(74) *Attorney, Agent, or Firm* — Klarquist Sparkman, LLP

(57) ABSTRACT

An optical apparatus includes a gain block operable to produce output light at an output wavelength in response to pumping and a resonant grating optically coupled to the gain block and situated to couple the output light at the output wavelength into the gain block and reflect the output light at the output wavelength along an output axis. A method of making a surface emitting laser includes depositing a gain region having one or more quantum wells on a semiconductor substrate, forming a metallic resonant diffraction grating adjacent the gain region, and coupling the gain region and the resonant grating to a thermally conductive substrate.

11 Claims, 5 Drawing Sheets

RESONANT ACTIVE GRATING MIRROR FOR SURFACE EMITTING LASERS

CROSS REFERENCE TO RELATED APPLICATION

This application claims the benefit of U.S. Provisional Application No. 61/933,811, filed on Jan. 30, 2014, which is incorporated herein by reference in its entirety.

FIELD

The disclosure pertains to surface emitting lasers and active mirrors.

BACKGROUND

Modern diode lasers are capable of delivering very high powers at high efficiency. For example, greater than 70% efficiency has been demonstrated with powers exceeding 100 W or greater having been obtained from a diode laser bar. However, these devices tend to require the use of incoherent, multi-mode optical sources, and the corresponding beams are difficult to focus effectively onto a target surface for materials processing. Conventional laser designs rely on the use of "brightness converters," i.e., where the light from such high efficiency diode lasers is used to pump another laser medium capable of providing a higher quality, single mode output, such as a solid-state YAG crystal or a fiber laser or amplifier. These pump lasers add cost and complexity while sacrificing efficiency, typically wasting 50% or more of the injected diode laser energy in the process of obtaining higher brightness outputs.

Optically-pumped surface-emitting lasers (OP-SEL) are an emerging laser class which combines the flexibility of quantum-well based gain materials and the beam quality of thin disk lasers. Moreover, the power can be scalable in two dimensions. Output power as high as 100 W has been demonstrated, which can be further scaled by arranging multiple semiconductor gain chips in the same cavity. One problem associated with power scaling OP-SELs is the difficulty in removing heat from the active region under optical pumping. Some examples disclosed herein provide substantially lower thermal resistance, permitting efficient, high power surface emitting laser operation. Overall efficiency of conventional OP-SELs remains relatively low as a result of inefficient pump absorption and large quantum defect between the pump and lasing wavelength. All of these need to be addressed for OP-SELs to achieve the power, efficiency and beam quality requirements for their use in a direct-diode solution for materials processing or for other applications.

SUMMARY

In some examples, optical apparatus include a gain block operable to produce output light at an output wavelength in response to pumping. A resonant grating is optically coupled to the gain block and situated to couple the output light at the output wavelength into the gain block and reflect the output light at the output wavelength along an output axis. In some alternatives, the gain block is a semiconductor gain block including at least one quantum well layer, and the gain block and resonant grating are formed in or on a common substrate. A heat conductive substrate can be thermally coupled to the gain block and the resonant grating. According to representative embodiments, a confinement layer is situated on a surface of the gain block that is opposite the resonant grating so as to form a planar waveguide, wherein the resonant grating is operable to couple the output light at the output wavelength into the planar waveguide. In typical examples, a pump source is coupled to the gain block so as to produce optical gain in the gain block. In other alternatives, an output coupler is situated along the output axis so that the resonant grating, the gain block, and the output coupler form an external cavity laser that produces an output beam at the output wavelength at a single longitudinal mode. In still further embodiments, the gain block includes a plurality of quantum well layers, and electrical contacts are coupled to the plurality of quantum well layers so as to deliver electrical pumping to the plurality of quantum well layers. In some examples, the resonant grating is a second-order, two-dimensional resonant grating or a second-order, one-dimensional resonant grating.

Active mirrors comprise a substrate and at least one quantum well layer situated on the substrate, wherein the at least one quantum well layer is operable to emit light at a laser wavelength. A resonant grating is situated between the at least one quantum well layer and the substrate and so as to reflect emitted light at the laser wavelength along an axis perpendicular to a surface of the at least one quantum well layer. In some examples, a confinement layer is situated opposite the resonant grating. In representative embodiments, the resonant grating is operable to direct light at the laser wavelength propagating along the axis to the resonant grating into the at least one quantum well layer. In some cases, the resonant grating has a thickness of less than about 1 μm and includes an $Al_xGa_{1-x}As$/metal layer. In some examples, the metal is Ag or Au. Typically, the resonant grating is a two-dimensional second-order grating and the refractive index of the grating varies in a direction perpendicular to the axis.

Surface emitting lasers comprise a pump source and an output coupler situated along an optical axis. A plurality of quantum well layers is situated along the optical axis and coupled to the pump source so as to provide optical gain in response to pumping by the pump source. A two-dimensional, second-order resonant grating is situated along the optical axis so as to diffract light at a laser wavelength into at least one of the plurality of quantum well layers and direct light at the laser wavelength propagating laterally in at least one of the quantum well layers so as to propagate along the optical axis to the output coupler, the output coupler and the resonant grating defining a laser cavity. A substrate is thermally coupled to the resonant grating and situated outside the laser cavity.

Methods of optical amplification include pumping an active layer with an optical pump beam or with an electrical pump. Laser light is generated at an output wavelength in the active layer, and at least a portion of the laser light is diffracted into the active layer with a second-order diffraction grating layer.

Methods of making of surface emitting lasers comprise forming a gain region having one or more quantum wells on a semiconductor substrate and forming a metallic resonant diffraction grating adjacent the gain region. The gain region and the resonant grating are coupled to a thermally conductive substrate. In some examples, the metallic resonant diffraction grating is formed by etching a predetermined pattern and depositing one or more metals on the pattern. In other embodiments, the metallic resonant diffraction grating is directly coupled to the thermally conductive substrate. In still other alternatives, a dielectric layer is deposited so as to be the etched pattern and the deposited metal. According to other examples, a confinement layer is deposited on the gain region on a surface of the gain region opposite a surface of the gain region facing the metallic resonant diffraction grating.

DETAILED DESCRIPTION

Figure 1:
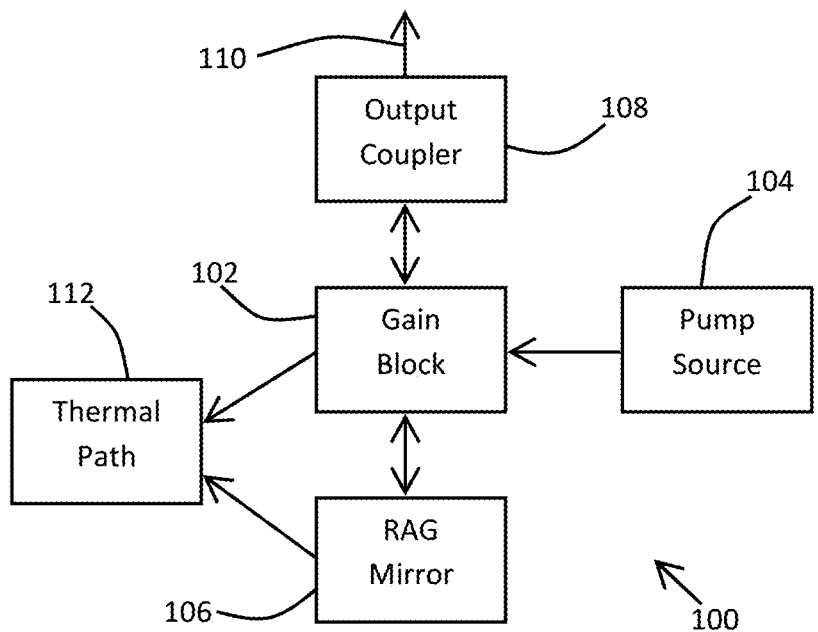
FIG. 1 is a schematic of a representative optical resonator that includes a resonant active grating (RAG) mirror.

The inventors have discovered that on-chip multiple layer distributed Bragg reflectors (DBRs) in conventional OP-SEL architectures represent a significant thermal resistance on the heat flow path from the gain region to the heat sink.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper," "lower," and the like. These terms are used for convenient description, but do not imply any particular spatial orientation.

Herein, "monolithic" can refer to the combination of various components of an apparatus being combined into a single object. In suitable monolithic arrangements, different components can have similar compositions while performing different functions. For example, monolithic semiconductor apparatus can include active and passive GaAs layers in which passive layers can perform waveguiding or structural functions and active layers can provide stimulated emission under different pumping schema.

As used herein, optical radiation refers to electromagnetic radiation at wavelengths of between about 100 nm and 10 μm, and typically between about 500 nm and 2 μm. Examples based on available laser diode sources generally are associated with wavelengths of between about 800 nm and 1700 nm. In some examples, propagating optical radiation can be referred to as one or more beams having diameters, beam cross-sectional areas, and beam divergences that can depend on beam wavelength and the optical systems used for beam shaping. For convenience, optical radiation is referred to as light in some examples, and need not be at visible wavelengths.

In some disclosed examples, scalable high power, high efficiency optically-pumped surface-emitting lasers (OP-SELs) having near-diffraction-limited beam quality are provided. With reference to FIG. 1, an optical apparatus 100 includes a gain block 102 situated to provide laser amplification at a laser wavelength. A pump source 104 is coupled to the gain block and includes one or more optical sources suitable for producing optical gain in the gain block 102. A resonant active grating (RAG) mirror 106 and an output coupler 108 are coupled to the gain block 102 and define a laser cavity that produces an output beam 110 that exits the laser cavity from the output coupler 108. A thermal path 112 is coupled to the gain block 102 and a RAG mirror 106 allowing heat to be removed to prevent component damage and to allow for improved performance and scaling of powers of the output beam 110. The thermal path 112 typically includes one or more elementals having high thermal conductivity that are or can be coupled to a coolant or heat sink.

Figure 3A:
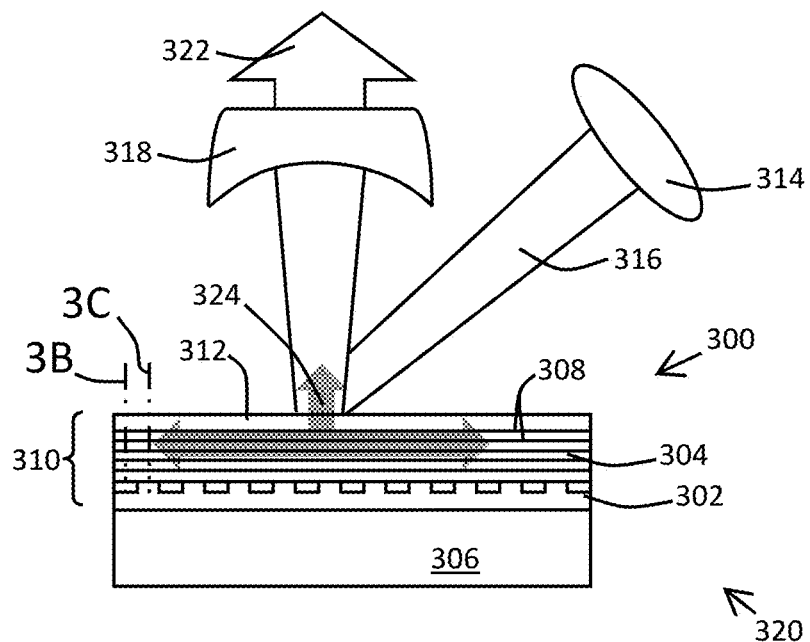
FIG. 3A is a cross-sectional view of a representative optically pumped surface-emitting laser having a RAG mirror.

Referring to FIG. 3A, a monolithic integration is provided of a resonant grating 302 and gain medium 304 so as to form a resonant active grating mirror 300. The inclusion of the resonant grating 302 can replace distributed Bragg reflector mirrors (DBRs) in conventional monolithically formed OP-SELs. Such conventional OP-SELs typically interpose a gain medium between distributed Bragg reflector mirrors. In FIG. 3A, the resonant active grating mirror 300 includes a thermally conductive substrate 306 such as a heatsink, a gain medium 304 having one or more gain medium layers 308 such as quantum well, quantum wire, or quantum dot layers, and the resonant grating 302 that is situated between the gain medium layers 304 and the substrate 306. In typical examples, the resonant grating 302 is a two dimensional, second order resonant grating, but one dimensional gratings can be used as well. A waveguide 310 is defined by a confinement layer 312 disposed in relation to the gain medium layers 308 opposite the resonant grating 302. The resonant active grating 302 diffracts an incident beam into the waveguide 310 and couples portions of the incident beam propagating in one or more waveguide modes as a reflected beams. The resonant grating 302 can operate as a narrow wavelength band reflector and provide reflectivity near unity at a resonance wavelength associated with the gain medium 304.

An optical pump source 314 is situated so as to deliver a pump beam 316 to the RAG mirror 300 so as to optically pump the gain medium 304. The output coupler 318 is situated above the RAG mirror 300 and defines an external laser cavity. The RAG mirror 300 typically provides very high reflectivity at a resonance wavelength which can result in low laser threshold and high output differential efficiency, as well as penalty-free wavelength selectivity and single longitudinal mode operation. In the configuration of FIG. 3A, lasing occurs in an external cavity defined by the resonant grating 302 and the output coupler 318. An optically pumped surface emitting laser 320 is formed that emits an output beam 322 from the output coupler 318.

Figure 2:
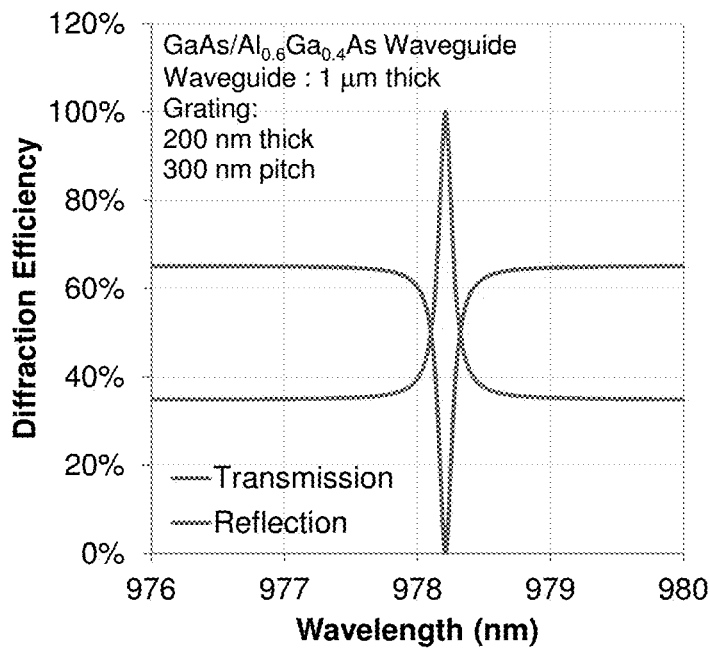
FIG. 2 is a chart showing simulated (reflection and transmission) efficiencies of a representative 980-nm RAG mirror with a GaAs/Al$_{0.6}$Ga$_{0.4}$As waveguide and an Al$_{0.6}$Ga$_{0.4}$As/metal grating.

In FIG. 2, simulation results are plotted for a representative 980-nm RAG mirror with a GaAs/Al$_{0.6}$Ga$_{0.4}$As waveguide and an Al$_{0.6}$Ga$_{0.4}$As/air grating. The plot results show a nominal 100% reflectivity and 0.1 nm spectral bandwidth at a resonant wavelength. A RAG mirror with these characteristics can then be integrated into a surface emitting laser, such as shown in FIG. 3A. The RAG mirror shown is an Al$_x$Ga$_{1-x}$As/Au grating that is situated between the multiple-quantum-well active region and the thermally conductive substrate. By replacing the multiple-layer semiconductor DBR mirror, which is typically several microns thick, with a thin semiconductor/metal grating, which can have sub-micron thickness, thermal resistance from the gain region to a thermally conductive substrate is significantly improved. The reduction in thermal resistance between the gain medium and the thermally conductive substrate can allow for greater power scaling capability and higher efficiency as compared to conventional SELs.

The resonant active grating mirror can allow interaction of the optical mode at the output wavelength with the one or more quantum-wells of the gain medium over a large area similar to optical mode extent in the operation of edge-emitting lasers. In FIG. 3, arrow 324 depicts the intra-cavity optical mode reflecting at the mirror 300 to vertically traverse the gain medium 304 and also to diffract at an angle into the waveguide 310 to laterally traverse the gain medium 304 along an interaction length. Thus, in some examples, resonant active grating mirror geometries can have the advantage of gain enhancement by coupling the incident wave at the output wavelength into the active waveguide mode for lateral gain.

At the same time, examples of resonant active grating mirrors can provide very high reflectivity without a stringent phase matching condition in the active waveguide or grating geometry. The high reflectivity without corresponding phase matching requirements can provide a distinct advantage over conventional SEL architectures. Accordingly, the oscillating beam in the external cavity reflects off the HR resonant active grating mirror and can also couple into the waveguide and interact with the gain medium (unlike other architectures) and then traverse back. This effectively enhances the interaction length of the optical mode and provides higher amplification. As a result, some RAG-mirror examples can provide much higher single pass gain compared to conventional SEL configurations.

Figure 4:
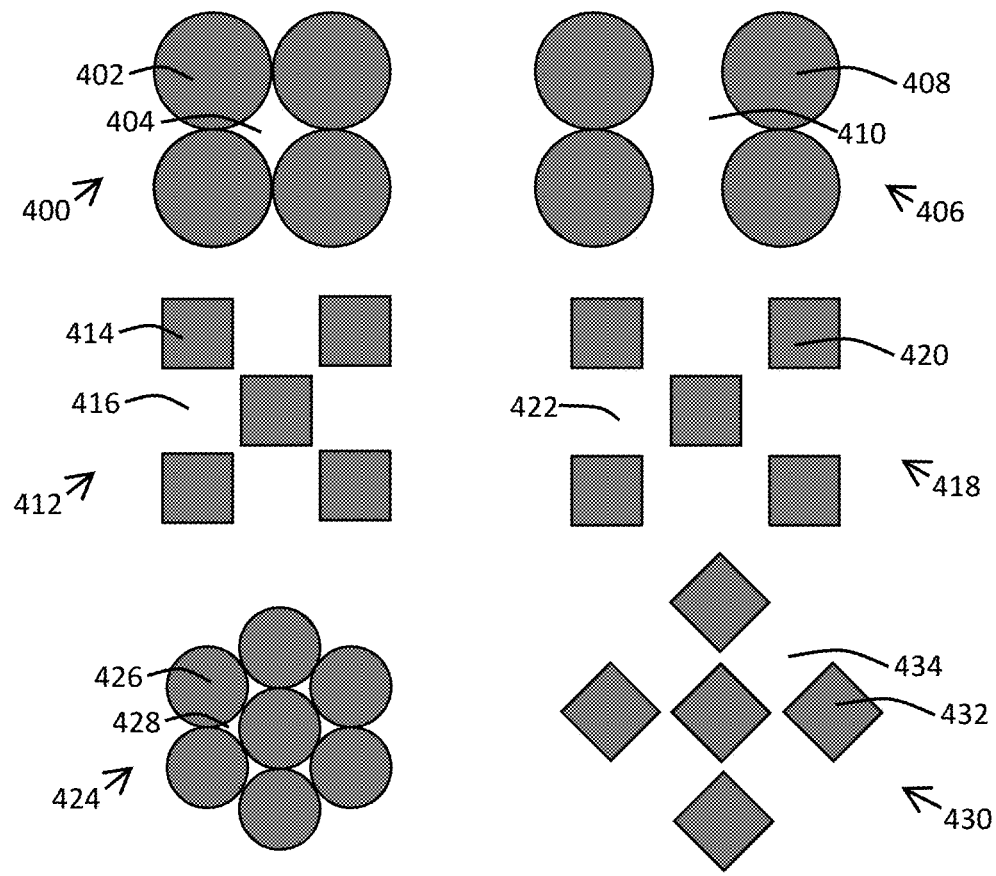
FIG. 4 illustrates pattern elements representative for RAG mirrors.
Figure 5:
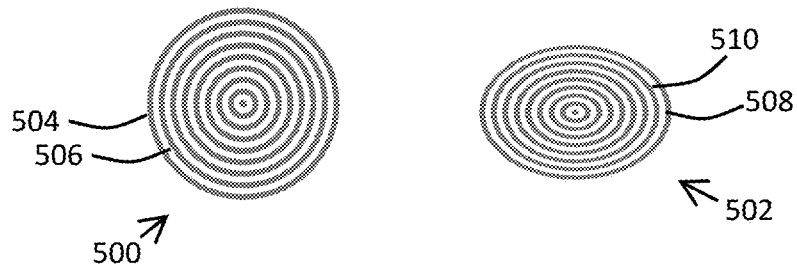
FIG. 5 illustrates additional pattern elements for RAG mirrors.

In some embodiments, the grating associated with the resonant active grating mirror is a second order diffraction grating to ensure surface emission. In some examples, the grating is two-dimensional grating pattern which is optimized to minimize diffraction losses. In other examples, the grating can be one-dimensional. FIGS. 4 and 5 show example grating geometries having index of refraction contrast. Example geometries for a two-dimensional grating can include square, rectangular, and hexagonal close-packed. Other photonic crystalline structures may also be suitable, such as when the structures provide optical confinement for all possible wave-vectors in the plane of the waveguide. In FIG. 4, a first configuration 400 includes a plurality of circular regions 402 of grating metal surrounded by opposite regions 404 of dielectric. In a second configuration 406, adjoining metal circular regions 408 are spaced apart from other adjoining circular regions 408 with regions of dielectric 410 disposed between the adjoining circular regions 408. In a third configuration 412, square metal regions 414 are evenly spaced apart from each other while a similar pattern is formed for dielectric regions 416. In a fourth configuration 418, square regions 420 are evenly spaced in a first planar direction but more spaced apart in a planar direction orthogonal to the first planar direction, leading to a similar pattern for dielectric regions 422. In a fifth example configuration 424, circular metal regions 426 are positioned in a close-packed hexagonal relationship leaving smaller interstitial dielectric regions 428. A sixth example configuration 430 includes spaced apart diamond-shaped metal regions 432 and corresponding diamond-shaped regions of dielectric 434. In further examples, metal and dielectric regions are interchanged. It will be appreciated that a large variety of patterns can be used, and features of the patterns can be selected in order to optimize diffraction effects of the active mirror for the selected spatial mode and resonant wavelength. Some example methods for the fabrication of grating structures and desired patterns can include e-beam lithography, multiple exposures with holographic patterning systems, nano-imprinting, and phase-masks. In FIG. 5, two further examples 500, 502 of a two-dimensional resonant active mirror grating are shown. Pattern 500 includes an alternating arrangement of circular metal regions 504 and circular dielectric regions 506. Pattern 502 includes an alternating arrangement of ovular metal regions 508 and ovular dielectric regions 510, which can provide a high polarization extinction ratio for the output beam of the resonant active grating mirror and surface emitting laser.

As mentioned hereinbefore, SELs typically use a thick dielectric DBR, which is typically several to tens of μm thick, in order to ensure high reflectivity. Herein, the thick dielectric DBR is replaced with a relatively thin high reflector that includes a two-dimensional grating inscribed onto a waveguide, with the grating being of second order relative to the emission wavelength of the laser. In some examples, the grating can be a semiconductor-on-semiconductor with sufficient index difference between the two semiconductor materials to provide sufficient feedback over a desirable interaction length. In other examples, the grating can be a semiconductor/metal (Ag, Au, etc.) grating providing very high index difference for high reflectivity over a short interaction length. Semiconductor/metal grating can also provide increased thermal conductivity. For electrically injected laser configurations (i.e., electrical pumping), resonant active grating mirror lasers as disclosed herein can have a relatively small voltage defect, as compared to conventional DBR mirror-based layers, which tend to have a large voltage defect due to the multiple hetero-interface barriers in the DBR stack.

Figure 8:
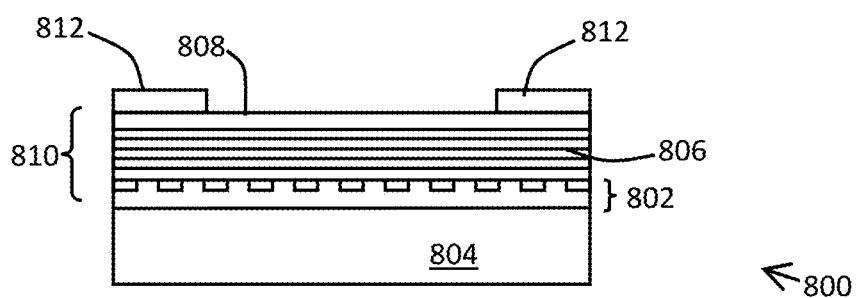
FIG. 8 is a side cross-sectional view of an electrically pumped surface emitting laser having a resonant active grating mirror.

FIG. 8 depicts an example of an electrically pumped resonant active grating mirror 800. The mirror 800 includes a grating second order metal grating 802 mounted on a thermally conductive substrate 804. A gain region 806 is optically coupled to the grating 802 opposite the substrate 804. A confinement layer 808 is optically coupled to the gain region 806 opposite the grating 802 so as to define a lateral waveguide 810. Electrical contacts 812 are electrically coupled to the waveguide 810 to allow electrical pumping of the gain region 806 through the top side while a conductive path for current can be provided by the metal grating layer 802 or thermally conductive substrate 804 or by dedicated contacts. The electrical contacts 812 are spaced apart to provide an aperture for an optical path for an output beam at laser threshold.

In SELs, the intra-cavity laser beam experiences amplification over the thickness of the associated gain medium, including the one or more quantum wells thereof (which typically have a thickness of less than 200 Angstroms). However, in resonant active grating mirror examples herein, the intra-cavity beam traverses the thickness of the gain, and is diffracted into a planar waveguide that includes a gain region and is subsequently diffracted out of the waveguide due to second order diffraction. As a result, the beam adds two more passes per trip over at least a portion of the length of the gain medium, which is typically on the order of hundreds of µm. This additional path length adds substantial advantage to the amplification process by way of the interaction length being enhanced by many thousands of times.

Figure 6:
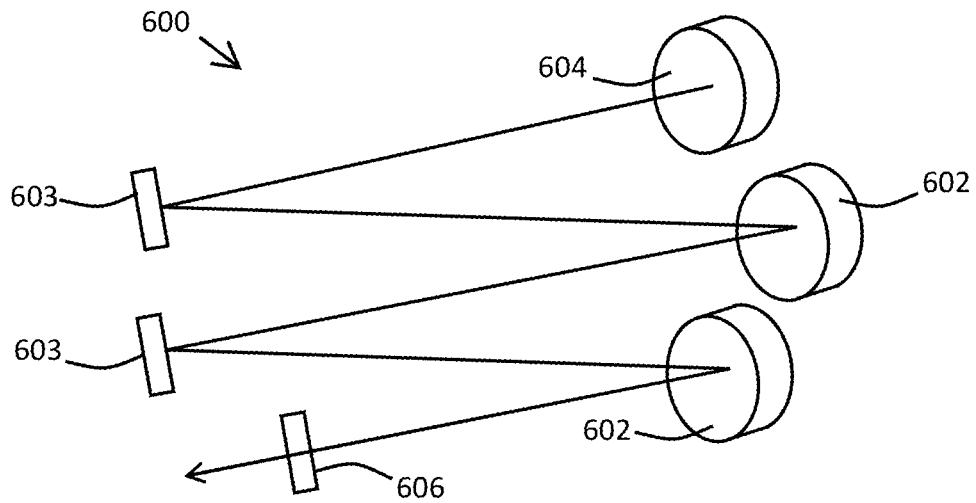
FIG. 6 is a perspective view of a power representative scalable optical source that includes multiple optically pumped surface emitting laser modules.
Figure 7:
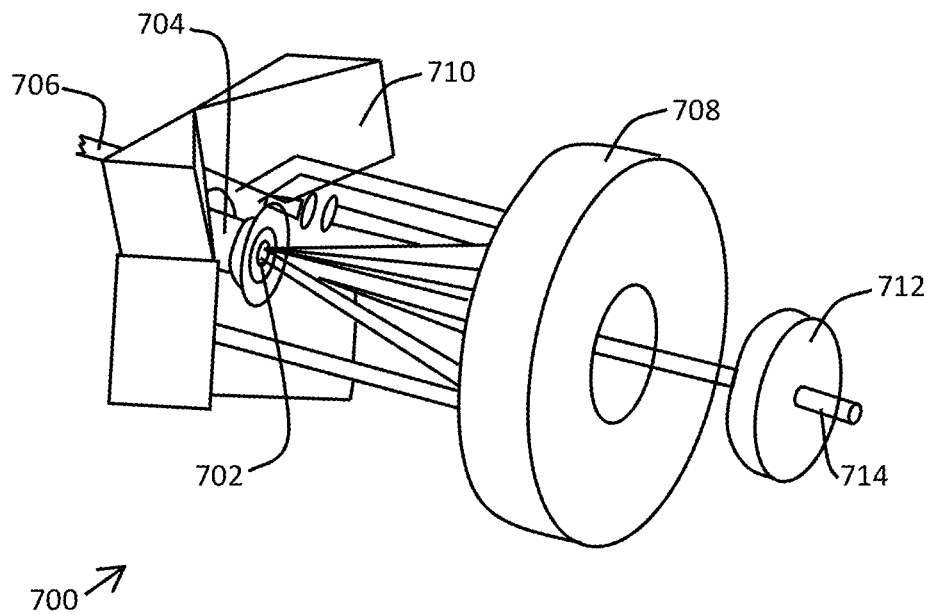
FIG. 7 is a perspective view of an optically pumped vertical external cavity surface emitting laser with a multi-pass pump beam configuration.

In some examples, substantially higher gain can be achieved in cascaded or enhanced pumping arrangements. Similar to thin disk laser technology, the power scaling in SELs can be achieved by integrating multiple modules in series within one laser cavity. In FIG. 6 there is shown a multiple module system 600 where the total output power of the system scales with the number of modules to the first order. The system 600 includes a plurality of gain modules 602 arranged in series and optically coupled to each other with interposed high reflectors 603. An end module 604 includes a narrow-band resonant active grating mirror to provide an HR for the system 600. Examples of modules 602 can include semiconductor gain disks mounted onto mirrors that reflect both pump and signal wavelengths, including DBRs or DBR-metal hybrid mirrors. The output power and conversion efficiency can be optimized by balancing the laser mode size, intra-cavity gain, and transmission of an output coupler 606 at an opposite end of the cascade of modules 602. It should be noted that in OP-SEL examples herein, superior beam quality can be obtained over conventional thin disk lasers due to reduced lateral optical phase distortion as a result of efficient heat removal and low quantum defect. FIG. 7 shows an optically pumped VECSEL system 700 with a multiple pump beam pass configuration. The system 700 includes a resonant active grating mirror 702 disposed on a heatsink 704, a pump source 706 providing pump light to a parabolic mirror 708 which redirects the pump light towards the mirror 702, deflection prisms 710 for redirecting pump light back to the parabolic mirror 708, and an output coupler 712 situated to define an external cavity through a central aperture of the parabolic mirror 708 and to provide a laser output beam 714.

Figure 3B:
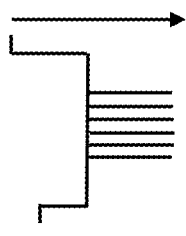
FIGS. 3B-3C illustrate refractive index profiles across selected cross-sections of the laser of FIG. 3A.
Figure 3C:
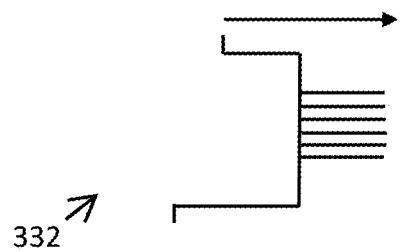

Second order resonant active gratings can be a semiconductor/semiconductor, with different semiconductors providing different indexes of refraction in order to provide index contrast for sufficient coupling strength. In alternative examples, the grating can include semiconductor on metal (Au, Ag, etc). Such semiconductor on metal examples have the additional advantage of higher index contrast, stronger coupling strength, higher thermal conductivity, and lower voltage defect when electrically pumped. In FIGS. 3B and 3C, respective refractive index profiles 330, 332 are shown for adjacent vertical cross-sections of the mirror 300. In profile 330, a somewhat larger refractive index can be seen in the grating layer 302 where dielectric is disposed. In profile 332, a relatively low index of refraction can be seen, representing a sharp index contrast, for the metallic region of the grating 302. In order to reduce electromagnetic field penetration into the grating and associated cavity loss, a phase-matching dielectric layer ($SiO_2$, SiN, etc.) can be disposed in a layer between dielectric and metallic portions of the grating.

As shown in FIG. 3A, some examples of resonant active grating mirrors can be integrated into a surface emitting laser. In other embodiments, the resonant active grating mirror can be monolithically integrated into a VCSEL architecture. In these latter examples, the bottom semiconductor/dielectric DBR and gain medium are replaced with a resonant active grating mirror.

OP-SELs are typically pumped by high power semiconductor diode lasers with photon energies above the bandgap of the barriers surrounding the quantum wells to ensure efficient pump absorption. As with thin disk lasers, however, this leads to large quantum defect between the pump and laser photon energies, which can typically be on the order of 20% in near-infrared OP-SELs. The overall laser efficiency and maximum achievable output power are hence limited. In an attempt to reduce quantum defect and improve efficiency, in-well rather than barrier pumping can be utilized and has been previously demonstrated to be effective, in which the pump energy is much closer to that of the emitting photons. Slope efficiency of 67% and optical-to-optical efficiency of 55% has been demonstrated using such a resonant pumping scheme.

To compensate for the relatively low pump absorption of in-well pumping, one or a combination of the following methods can be applied to achieve the highest pump absorption efficiency. First, pump absorption in the quantum wells can be greatly enhanced by designing a micro-cavity that places the quantum wells in regions of maximum spatial overlap with both the pump and laser standing-wave pattern. Additionally, energy-band-engineering of the quantum wells and barriers can be applied to reduce bleaching of quantum well absorption at the pump wavelength, which becomes possible now that the lasing wavelength is stabilized at the resonant wavelength determined by the narrow-band resonant active grating mirror Bragg condition. Also, special optics can be used to recirculate the pump beams with a multiple pump beam pass configuration, one example being depicted in FIG. 7. Aspects of the foregoing techniques have been successfully used in thin disk laser configurations generating several kilowatts of CW power, and can be useful in resonant active grating mirror configurations as well.

Figure 9:
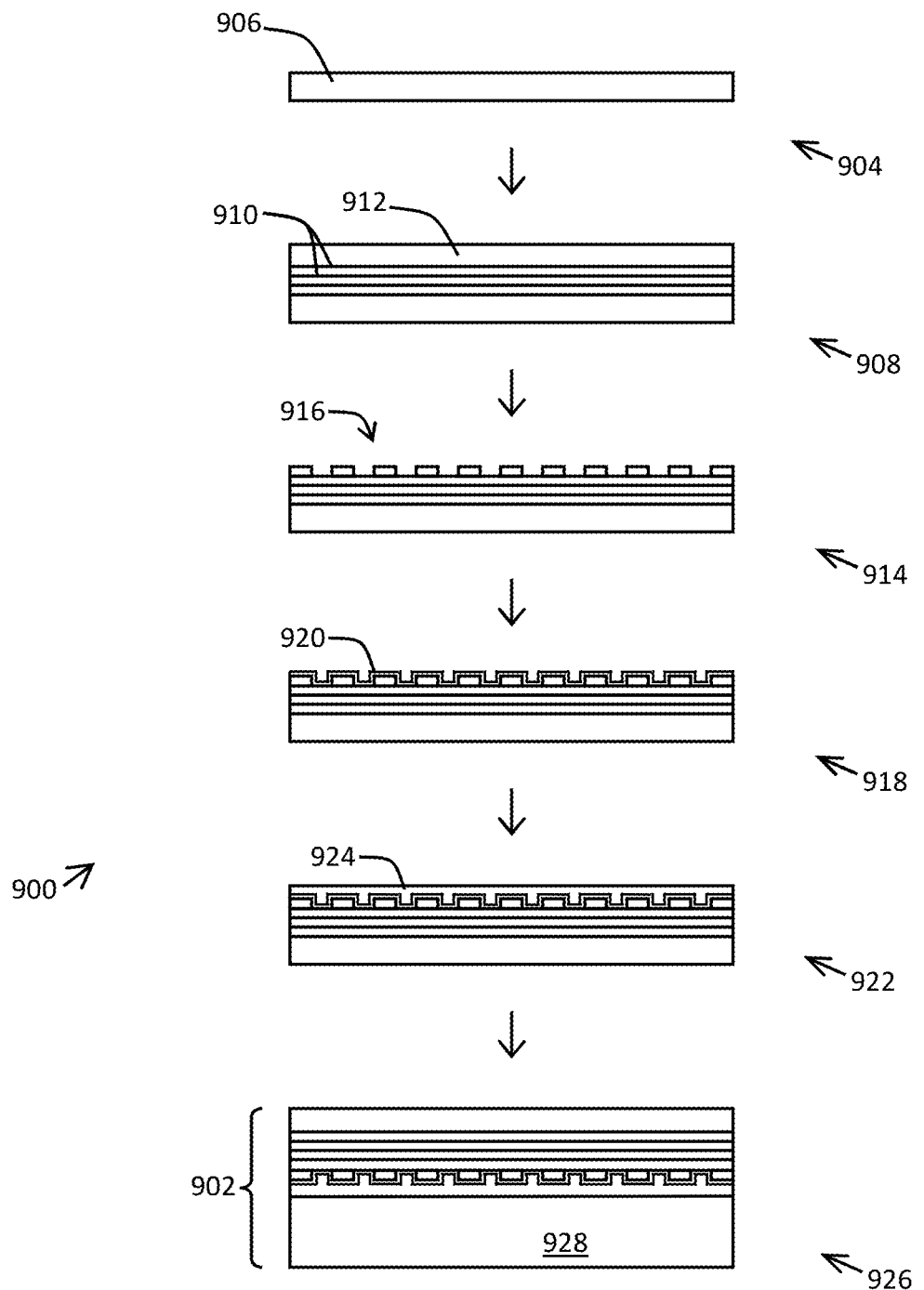
FIG. 9 is a flow schematic of a method of fabricating a RAG mirror.

FIG. 9 is a flow schematic showing an example of a representative method 900 for fabricating a resonant active grating mirror 902. At 904, a GaAs substrate 906 or other suitable semiconductor substrate or wafer structure is provided. At 908, additional semiconductor layers are epitaxially grown on the substrate 906, including quantum well layers 910 and a confinement dielectric layer 912. Various methods can be used for growth of semiconductor layers, including metal-organic chemical vapor deposition and photolithography. At 914, dielectric layer 912 is etched away so as to form a predetermined 1-d or 2-d dielectric grating pattern 916. A second order grating pattern etch-mask is formed by one of various techniques, such as electron-beam lithography, laser holography, photolithography, or nano-imprinting technology on a suitable photoresist or electron-beam resist. At 918, a phase-matching dielectric layer 920 can be grown on the pattern 916 to provide reduced loss during laser operation, the loss being associated with penetration of electromagnetic field into the metal grating. At 922, a or metal layer 924 providing a suitable refractive index contrast with respect to the patterned dielectric 916 is formed over the pattern 916. At 926, the combination of layers is then flipped and an exposed surface of the metal layer 924 is secured to a thermally conductive substrate 928 so as to form the active grating mirror 902. In semiconductor-on-semiconductor grating examples, at 922 a semiconductor layer of different refractive index would be grown on the grating pattern 916.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We claim all that comes within the scope and spirit of the appended claims.

We claim:

1. An optical apparatus, comprising:
    a thermally conductive substrate;
    a semiconductor gain block coupled to the thermally conductive substrate and having at least one quantum well layer, the semiconductor gain block operable to produce output light at an output wavelength in response to pumping; and
    a resonant grating coupled to the substrate and optically coupled to the gain block and situated to couple the output light at the output wavelength into the gain block and reflect the output light at the output wavelength along an output axis;
    wherein the semiconductor gain block includes a confinement layer disposed on a surface of the gain block that is opposite the resonant grating so as to form a planar waveguide and the resonant grating is situated to couple the output light at the output wavelength into the planar waveguide.

2. The apparatus of claim 1, further comprising a pump source coupled to the gain block so as to produce optical gain in the gain block.

3. The apparatus of claim 2, further comprising an output coupler situated along the output axis so that the resonant grating, the gain block, and the output coupler form an external cavity laser that produces an output beam at the output wavelength at a single longitudinal mode.

4. The apparatus of claim 3, wherein the gain block includes a plurality of quantum well layers, and further comprising electrical contacts coupled to the plurality of quantum well layers so as to deliver electrical pumping to the plurality of quantum well layers.

5. The apparatus of claim 1 wherein the resonant grating is a second-order, two-dimensional resonant grating.

6. An active mirror, comprising:
    a substrate;
    at least one quantum well layer situated on the substrate, the at least one quantum well layer operable to emit light at a laser wavelength; and
    a resonant grating disposed between the at least one quantum well layer and the substrate and situated to reflect emitted light at the laser wavelength along an axis perpendicular to a length of the at least one quantum well layer;
    wherein the resonant grating includes an $Al_xGa_{1-x}As$/metal layer having a thickness of 1 μm or less and a refractive index that varies in a direction parallel to the length of the at least one quantum well layer.

7. The active mirror of claim 6, further comprising a confinement layer disposed opposite the resonant grating.

8. The active mirror of claim 6, wherein the resonant grating is situated to direct light at the laser wavelength into the at least one quantum well layer that is propagating along the axis to the resonant grating.

9. The active mirror of claim 6, wherein the metal is Ag or Au.

10. The active mirror of claim 6, wherein the resonant grating is a two-dimensional second-order grating.

11. A surface emitting laser, comprising:
    a pump source;
    an output coupler situated along an optical axis;
    a plurality of quantum well layers situated along and perpendicular to the optical axis and coupled to the pump source so as to provide optical gain in response to pumping by the pump source;
    a two-dimensional second-order resonant grating situated along the optical axis and having a refractive index that varies in a direction perpendicular to the optical axis so as to diffract light at a laser wavelength into at least one of the plurality of quantum well layers and direct light at the laser wavelength that is propagating laterally in at least one of the quantum well layers so that the light propagates along the optical axis to the output coupler, the output coupler spaced apart from the resonant grating along the optical axis, the output coupler and the resonant grating defining mirror ends of a laser cavity; and
    a substrate thermally coupled to the resonant grating and situated outside the laser cavity;
    wherein the plurality of quantum well layers is situated in the laser cavity.

* * * * *